United States Patent
Duval et al.

(10) Patent No.: US 11,880,249 B2
(45) Date of Patent: Jan. 23, 2024

(54) ELECTRONIC SYSTEM FOR GENERATING MULTIPLE POWER SUPPLY OUTPUT VOLTAGES WITH ONE REGULATION LOOP

(71) Applicant: THALES DIS FRANCE SAS, Meudon (FR)

(72) Inventors: Benjamin Duval, Saint Maximin (FR); Olivier Fourquin, Fuveau (FR); Frederic Demolli, Gignac la Nerthe (FR)

(73) Assignee: THALES DIS FRANCE SAS, Meudon (FR)

( * ) Notice: Subject to any disclaimer, the term of this patent is extended or adjusted under 35 U.S.C. 154(b) by 0 days.

(21) Appl. No.: 17/766,759

(22) PCT Filed: Sep. 30, 2020

(86) PCT No.: PCT/EP2020/077420
§ 371 (c)(1),
(2) Date: Apr. 6, 2022

(87) PCT Pub. No.: WO2021/069281
PCT Pub. Date: Apr. 15, 2021

(65) Prior Publication Data
US 2023/0152869 A1    May 18, 2023

(30) Foreign Application Priority Data

Oct. 10, 2019 (EP) ..................................... 19306329

(51) Int. Cl.
*G06F 1/26* (2006.01)
*H02M 3/155* (2006.01)

(52) U.S. Cl.
CPC .............. *G06F 1/26* (2013.01); *H02M 3/155* (2013.01)

(58) Field of Classification Search
CPC .......... G06F 1/26; H02M 3/155; G05F 1/575; G05F 1/577; H03F 2200/453;
(Continued)

(56) References Cited

U.S. PATENT DOCUMENTS 6,570,371 B1 * 5/2003 Volk ......................... G05F 3/262
                                                              323/315
2005/0231280 A1 * 10/2005 Kurokawa ............ H03F 3/2171
                                                              330/251
(Continued)

OTHER PUBLICATIONS

Karki, James, Fully-Differential Amplifiers, Sep. 2016, Texas Instruments, p. 4 (Year: 2016).*
(Continued)

*Primary Examiner* — Danny Chan

(57) ABSTRACT

Provided is a an electronic system (1) comprising a plurality of sub blocks (21, 22, . . . ), a differential amplifier (3), a voltage regulation loop comprising a first transistor (40) and a variable resistor (5), and a plurality of additional transistors (41, 42, . . . ). The input reference voltage (VRF) and the variable resistor are configured such that a first sub block (21) is supplied with its required power supply output voltage (VDD1) by the transistor to which it is connected. The amplifier is configured to output on each of its outputs a power supply reference voltage (VG1, VG2 . . . ) such that each sub block (22, . . . ) other than the first sub block is supplied with its required power supply output voltage (VDD2 . . . ) by the transistor to which it is connected.

6 Claims, 2 Drawing Sheets

(58) Field of Classification Search
CPC ..... H03F 2200/456; H03F 2203/45722; H03F 3/45183; H03F 3/45475; H03F 3/505; H03F 3/68; H03F 3/45; H03F 3/50; G11C 5/14; G11C 16/30
See application file for complete search history.

(56) References Cited

U.S. PATENT DOCUMENTS

| | | | |
|---|---|---|---|
| 2009/0302815 A1* | 12/2009 | Tanzawa | G11C 5/145 |
| | | | 307/31 |
| 2010/0109435 A1 | 5/2010 | Ahmadi | |
| 2012/0038390 A1* | 2/2012 | Raghavan | H03K 3/012 |
| | | | 327/199 |
| 2012/0205978 A1 | 8/2012 | Wong | |
| 2014/0062594 A1* | 3/2014 | Sbuell | H03F 3/45475 |
| | | | 330/253 |
| 2016/0072447 A1* | 3/2016 | Seth | H03F 3/245 |
| | | | 330/259 |

OTHER PUBLICATIONS

International Search Report (PCT/ISA/210) and Written Opinion (PCT/ISA/237) dated Dec. 1, 2020, by the European Patent Office as the International Searching Authority for current International Application No. PCT/EP2020/077420—[13 pages].

* cited by examiner

Fig. 3
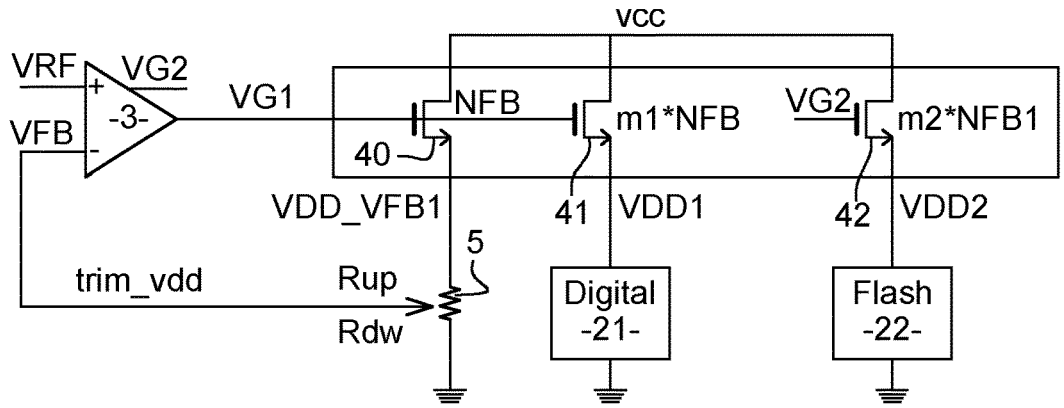
Fig. 4
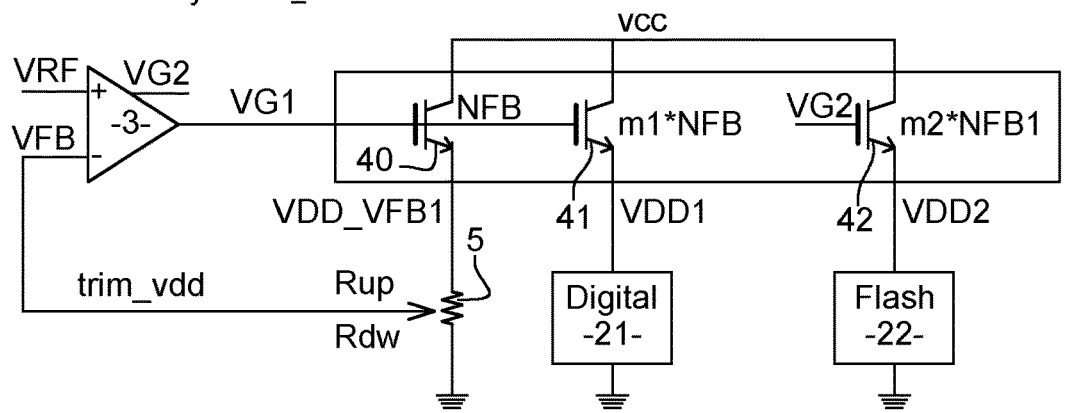
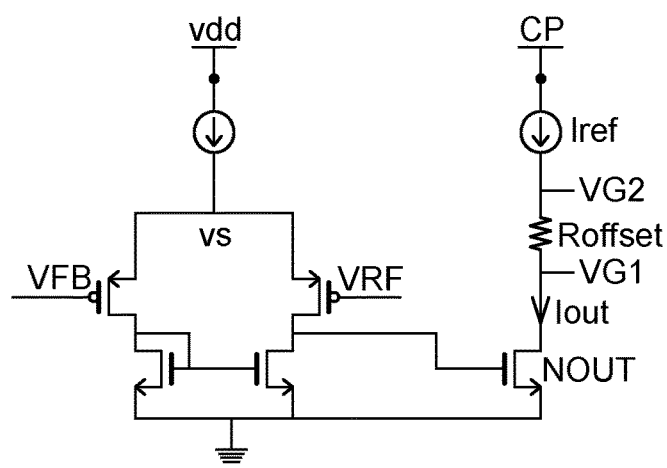
Fig. 5

ELECTRONIC SYSTEM FOR GENERATING MULTIPLE POWER SUPPLY OUTPUT VOLTAGES WITH ONE REGULATION LOOP

FIELD OF THE INVENTION

The present invention relates to the field of electronic power supply, and more particularly to an electronic system enabling to produce multiple power supply output voltages using only one regulation loop.

BACKGROUND OF THE INVENTION

Existing electronic circuits are not designed to be supplied with the same power supply voltage. For example some digital circuit may require a 1.2 V power supply, whereas a flash memory requires a 1.5 V power supply.

As a result, any electronic system needs to have a power supply able to output the power supply voltage required for the components it includes.

FIG. 1 shows an existing power supply architecture using a capacitor-less regulation loop with NMOS feedback. In such an architecture, a differential amplifier is supplied with an input reference voltage VRF on one of its terminals, and its output VG is connected to the gate of a transistor NFB. The source of this transistor is at a voltage VDD_VFB and is fed back to the other terminal of the amplifier through a variable resistor. The system also includes a second transistor whose gate is connected to the amplifier output and whose source is connected to a digital sub-block which is then supplied with a voltage VDD almost equal to VDD_VFB. The input reference voltage VRF and the variable resistor may be set such that VDD voltage is set to any desired value.

Most electronic systems comprise multiple sub-blocks which cannot be all supplied with the same voltage. Consequently, such systems must include a power supply unit able to deliver multiple different power supply output voltages at the same time.

The architecture shown on FIG. 1 may be replicated as many times as the number of required different power supply output voltages, each copy supplying one system sub-block with its required voltage, as shown on FIG. 2 for two sub-blocks. Nevertheless such a solution is not applicable to integrated systems with high constraints on the available silicon area such as System-On-Chip (SOC).

Consequently, there is a need for an electronic system including a power supply able to output a plurality of different power supply output voltage to various sub-blocks, with a lower silicon area and current consumption than existing power supply architectures.

SUMMARY OF THE INVENTION

For this purpose and according to a first aspect, this invention therefore relates to an electronic system comprising:
- a plurality of sub blocks, each one being required to be supplied with a different power supply output voltage,
- a differential amplifier having a plurality of outputs, an input reference voltage being applied to a first input of the amplifier,
- a voltage regulation loop with a transistor feedback connected to a first output of the amplifier and to a second input of the amplifier, said loop comprising a first transistor and a variable resistor,
- a plurality of additional transistors, each output of the amplifier being connected to a gate or base of one of said additional transistors and the drain, source, emitter or collector of each additional transistor being connected to one of said sub-blocks, wherein:
the input reference voltage and the variable resistor are configured such that a first sub block is supplied with its required power supply output voltage by the transistor it is connected to,
and said amplifier is configured to output on each of its outputs a power supply reference voltage such that each sub block other than the first sub block is supplied with its required power supply output voltage by the transistor it is connected to.

Such a system enables to generate as many power supply output voltages as required by the sub-blocks of the system to be powered up, with only one amplifier and one regulation loop.

In an embodiment, a last stage of said amplifier comprises at least one component configured such that when the potential at one of its terminals is set to a first power supply reference voltage, a second power supply reference voltage is generated at the other terminal of said component.

It enables to generate easily multiple different voltage outputs of the amplifier with reduced silicon area cost and current consumption.

Said component may be among a resistance, a diode, a MOS transistor, or a switched capacitor.

Said sub blocks may be among a flash memory, a digital circuit, an analog circuit or an input/output interface.

As an example, said first sub block may be a digital circuit to be supplied with a first power supply output voltage equal to 1.2 V, a second sub block may be a flash memory to be supplied with a second power supply output voltage equal to 1.5 V and said component may be a resistance set to a value equal to 300 mV divided by the current flowing through it.

According to a second aspect, this invention therefore relates also to a System-On-Chip comprising an electronic system according to the first aspect.

To the accomplishment of the foregoing and related ends, one or more embodiments comprise the features hereinafter fully described and particularly pointed out in the claims.

BRIEF DESCRIPTION OF THE DRAWINGS

The following description and the annexed drawings set forth in detail certain illustrative aspects and are indicative of but a few of the various ways in which the principles of the embodiments may be employed. Other advantages and novel features will become apparent from the following detailed description when considered in conjunction with the drawings and the disclosed embodiments are intended to include all such aspects and their equivalents.

FIG. 3 is a schematic illustration of an electronic system according to the present invention using MOS transistors;

FIG. 4 is a schematic illustration of an electronic system according to the present invention using bipolar transistors;

FIG. 5 is a schematic illustration of an amplifier architecture based on a PMOS transistor differential pair according to an embodiment of the present invention.

DETAILED DESCRIPTION OF EMBODIMENTS OF THE INVENTION

According to a first aspect, as shown on FIG. 3, the invention relates to an electronic system 1, comprising a plurality of sub blocks 21, 22 . . . each sub block being required to be supplied with a different power supply output voltage VDD1, VDD2 . . . . Such sub-blocks may for example be a flash memory which should be supplied with a 1.5 V voltage, a digital circuit which should be supplied with a 1.2 V voltage, an analog circuit, an input/output interface . . . .

Such an electronic system may be embedded in a portable electronic device. It may for example be included in a smartcard chip or included in a System-On-Chip (SOC).

In order to generate the voltages to be supplied to the sub-blocks, the system 1 also includes a differential amplifier 3. This amplifier has a specific design with a plurality of outputs. An input reference voltage VRF is applied to a first input of the amplifier. In the example show on FIG. 3, the input reference voltage VRF is applied to the positive input of the amplifier.

In order to make the amplifier output constant voltages equal to desired values, the system comprises a capacitor less voltage regulation loop with a transistor feedback. This loop is connected on one end to a second input of the amplifier. In the example of FIG. 3, it is connected to the negative input of the amplifier. In FIG. 3, all the transistors used in the electronic system, including the one for feedback, are MOS transistor. FIG. 4 gives another example in which all the transistors used in the system are bipolar transistors. In the rest of the application, description will refer to FIG. 3 and the transistors used in the system will be referred to as being MOS transistors but any other kind of transistor, such as bipolar transistors, may be used instead, with the same effect.

Figure 1:
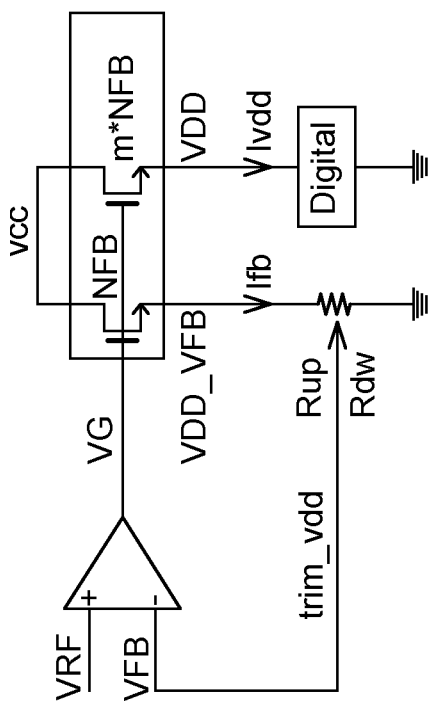
FIG. 1 is a schematic illustration of an existing power supply architecture using a capacitor-less regulation loop with NMOS feedback.
Figure 2:
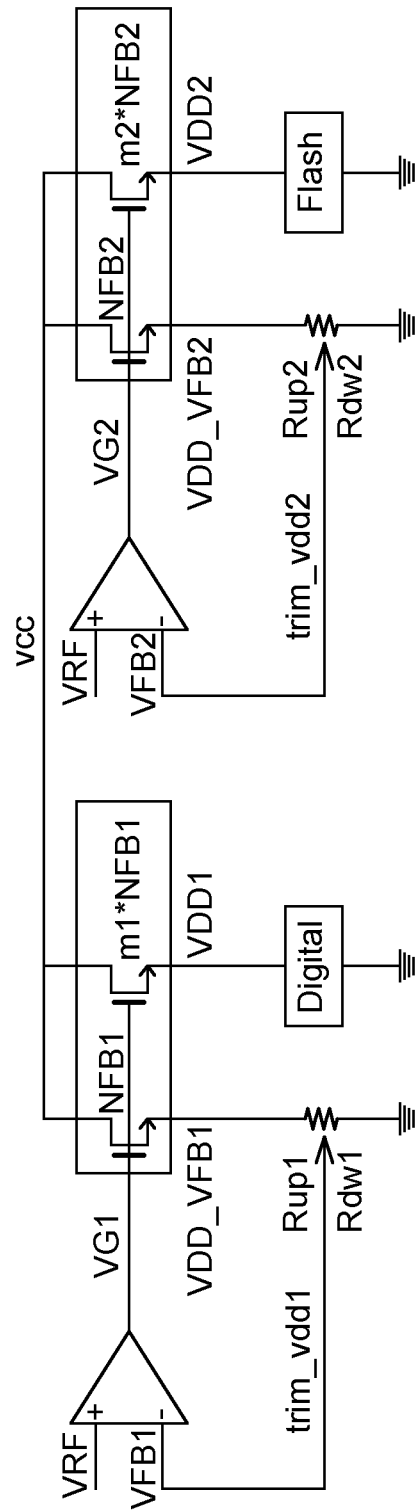
FIG. 2 is a schematic illustration of a power supply architecture generating two power supply output voltages for two sub-blocks.

The voltage at the second input of the amplifier is noted VFB. The loop is connected on the other end to a first output of the amplifier, outputting a power supply reference voltage VG1. This loop includes a first MOS transistor 40 and a variable resistor 5. In the example shown on FIG. 3, this transistor is a NMOS transistor. The threshold voltage of the first transistor is noted VTH (In the case of bipolar transistors, the transistor is characterized by its base-emitter voltage VBE instead of a threshold voltage VTH). The architecture of this regulation loop is the same as the one presented on FIG. 1. The first output of the amplifier is connected to the gate of the first transistor 40 (or to its base in the case of bipolar transistors). The source of the first transistor (or its emitter terminal in case of bipolar transistor) is connected to one end terminal of the variable resistor and the middle terminal of the variable resistor is connected to the second input of the amplifier.

The voltage at the source of the first transistor is noted VDD_VFB, the resistance between the source of the first transistor and the second input of the amplifier is noted $R_{up}$, the resistance between the second input of the amplifier and the ground is noted $R_{down}$. In such a configuration, when the amplifier is supposed to be ideal (VRF=VFB), VDD_VFB and VG1 verify the following equation:

$$VDD\_VFB = VRF*(R_{up}+R_{down})/R_{down} = VG1-VTH$$

Finally, in order to supply various power supply output voltages to the sub-blocks of the system, the system includes a plurality of additional MOS transistors 41, 42 . . . . Each output of the amplifier is connected to the gate of one of these additional MOS transistors and the drain or source of each additional transistor is connected to one of the sub-blocks of the system in order to supply it with its required voltage.

In the example of FIG. 3, the system includes two sub-blocks and two additional NMOS transistors. The gate of the first additional transistor is connected to the first output of the amplifier, which is at voltage VG1, and its source supplies a voltage VDD1 to the first sub-block. The gate of the second additional transistor is connected to a second output of the amplifier, which is at voltage VG2, and its source supplies a voltage VDD2 to the second sub-block.

The first transistor 40 has a grid width W and a grid length L. The first additional transistor 41 has a grid width W1 and a grid length L1. Let's introduce scaling factor m1 defined by the relation: W1/L1=m1*W/L. If the currents flowing out of the sources of the first transistor and of the first additional transistor are respectively named IFB and IDD1, IFB is proportional to $W/L*(VG1-VDD\_FB-VTH)^2$ and IDD1 to $W1/L1*(VG1-VDD1-VTH)^2$. For a given value of IDD1 drained by the first sub-block, the ratio W1/L1 of the first additional transistor may be set such that IFB*L/W=IDD1*L1/W1, ie m1=IDD1/IFB, with IFB equal to VDD_FB/($R_{up}+R_{down}$). In such a configuration, the power supply output voltage VDD1 supplied to the first sub-block by the first additional MOS transistor 41 connected to the first output of the amplifier is almost equal to the voltage VDD_VFB at the source of the first transistor of the regulation loop, which also has its gate connected to the first output of the amplifier, i.e. VDD1=VDD_VFB.

Consequently, in order to supply the first sub-block with its required power supply output voltage VDD1, the input reference voltage VRF and the variable resistor are configured such that a first sub block is supplied with its required power supply output voltage VDD1 by the MOS transistor it is connected to. Said differently, VRF and $R_{up}/(R_{up}+R_{down})$ are set such that:

$$VRF*(R_{up}+R_{down})/R_{down} = VDD1$$

Which leads to VG1=VDD1+VTH

Such equations do not take into account voltage fluctuations or offsets due to design imperfections such that the fact that the amplifier is not ideal, variations of the input reference voltage VRF . . . . In order to take into account such imperfections, VDD1 and VG1 may be accurately set by performing a trimming process.

In addition, for each additional transistor i, the voltage VDDi at its terminal connected to the sub-block it supplies and the power supply reference voltage VGi supplied by the output of the amplifier to which its gate is connected verify the following equation: VGi=VDDi+VTHi with VTHi the threshold voltage of the transistor. As described here above for the first additional transistor, the ratio grid width/grid length (Wi/Li=mi*W/L) of each additional transistor may be set to have the desired current flowing out of the source of the transistor towards its sub-block.

In order to supply every sub-blocks with their required power supply output voltage, the amplifier is configured to output on each of its outputs a different power supply reference voltage VG1, VG2 . . . such that each sub block other than the first sub block is supplied with its required power supply output voltage (VDD2 . . . ) by the MOS transistor it is connected to. Said differently, the amplifier is configured to output on its output i a voltage VGi such that VGi=VDDi+VTHi which ensures that the sub-block supplied by the ith additional transistor connected to this output will be supplied with its required power supply output voltage VDDi.

In order to generate a plurality of power supply reference voltages, additional components which generate a voltage offset may be included in the amplifier. More precisely, the last stage of the amplifier may comprise at least one component configured such that when the potential at one of its terminals is set to a first power supply reference voltage VG1, a second power supply reference voltage VG2 . . . is generated at the other terminal of said component.

Such a component may for example be a resistance, a diode, a MOS transistor, switched capacitors . . . .

An example of such an architecture of the amplifier is given on FIG. 5. In such an example, the amplifier architecture is based on a PMOS transistor differential pair. It generates a first power supply reference voltage VG1 at the drain of its output transistor NOUT. A resistor Roffset is inserted between the transistor NOUT and the current source Iref. It generates a voltage offset Voff which leads to a voltage VG2=VG1+Voff at its terminal connected to the current source Iref.

In such an example, when such an amplifier is used in the configuration of FIG. 3, the first sub block is a digital circuit to be supplied with a first power supply output voltage VDD1 equal to 1.2 V, the second sub block is a flash memory to be supplied with a second power supply output voltage VDD2 equal to 1.5 V. In such a case, the offset to be generated between VG1 and VG2 is 300 mV and the component is a resistance set to a value equal to 300 mV divided by the current flowing through it. When the current Iref is set to 1 µA, the resistance is set to 300 k Ohms.

When VDDi is lower than VDD1, a negative offset is needed. In such a case the component to be added to the amplifier may be inserted between the first output of the amplifier and the output transistor NOUT.

As a result, the system according to the invention enables to generate as many power supply output voltages as required by the sub-blocks of the system to be powered up, with only one amplifier and one regulation loop. Silicon area and power consumption are reduced. Only one trimming process is required to set precisely all the power supply output voltages to their required values.

The invention claimed is:

1. An electronic system (1) comprising:
a plurality of sub blocks (21, 22, . . . ), each one being required to be supplied with a different power supply output voltage (VDD1, VDD2, . . . ),
a differential amplifier (3) having a plurality of outputs, an input reference voltage (VRF) being applied to a first input of the differential amplifier,
a voltage regulation loop with a transistor feedback connected to a first output of the differential amplifier and to a second input of the differential amplifier, said loop comprising a first transistor (40) and a variable resistor (5) external to the differential amplifier (3),
a plurality of additional transistors (41, 42, . . . ), each output of the differential amplifier being connected to a gate or base of one of said additional transistors and the drain, source, emitter or collector of each additional transistor being connected to one of said sub-blocks, and
a last stage of said differential amplifier (3) comprising at least one component internal to the differential amplifier (3) and additional to said variable resistor (5) that delivers multiple different power supply output voltages from said differential amplifier (3);
wherein:
the input reference voltage (VRF) and the variable resistor are configured such that a first sub block (21) is supplied with its required power supply output voltage (VDD1) by the transistor it is connected to,
and said differential amplifier is configured to output on each of its outputs a power supply reference voltage (VG1, VG2) such that each sub block (22, . . . ) other than the first sub block is supplied with its required power supply output voltage (VDD2 . . . ) by the transistor it is connected to;
wherein a potential at one of said at least one component terminals is set to a first power supply reference voltage (VG1), a second power supply reference voltage (VG2) is generated at an other terminal of said at least one component;
wherein said at least one component is among a resistance, a diode, a MOS transistor, or a switched capacitor;
wherein the at least one component in the last stage of said differential amplifier (3) generates a resistor offset (Roffset) between an output transistor NOUT and a current source Iref of the differential amplifier (3) to generate a first power supply reference voltage VG1 at a drain of the output transistor NOUT and generate a voltage offset Voff leading to a voltage VG2=VG1+Voff at its terminal connected to the current source Iref.

2. The electronic system according to claim 1, wherein said sub blocks are among a flash memory (22), a digital circuit (21), an analog circuit, or an input/output interface.

3. The electronic system according to claim 2, wherein said first sub block (21) is a digital circuit to be supplied with a first power supply output voltage (VDD1) equal to 1.2 V, a second sub block (22) is a flash memory to be supplied with a second power supply output voltage (VDD2) equal to 1.5 V and said at least one component is a resistance set to a value equal to 300 mV divided by the current flowing through it.

4. The electronic system of claim 1 is embedded on a System-On-Chip (SOC).

5. The electronic system of claim 1 is embedded in a smartcard chip of a smartcard.

6. An electronic system (1) comprising:
a plurality of sub blocks (21, 22, . . . ), each one being required to be supplied with a different power supply output voltage (VDD1, VDD2, . . . ),
a voltage regulation loop with a transistor feedback connected to a first output of a differential amplifier and to a second input of the differential amplifier, said loop comprising a first transistor (40) and a variable resistor (5) external to the differential amplifier (3),
the differential amplifier (3) having a plurality of outputs, an input reference voltage (VRF) being applied to a first input of the differential amplifier (3);
wherein said differential amplifier (3) includes a last stage comprising at least one component among a resistance, a diode, a MOS transistor, or a switched capacitor that is internal to the differential amplifier (3);
wherein the at least one component said differential amplifier (3) to drive multiple different power supply output voltages; and
a plurality of additional transistors (41, 42, . . . ), each output of the differential amplifier being connected to a gate or base of one of said additional transistors and the drain, source, emitter or collector of each additional transistor being connected to one of said sub-blocks, wherein:

the input reference voltage (VRF) and the variable resistor are configured such that a first sub block (21) is supplied with its required power supply output voltage (VDD1) by the transistor it is connected to, and said differential amplifier is configured to output on each of its outputs a power supply reference voltage (VG1, VG2) such that each sub block (22, ... ) other than the first sub block is supplied with its required power supply output voltage (VDD2 ... ) by the transistor it is connected to;

wherein the at least one component in the last stage of said differential amplifier (3) generates a resistor offset (Roffset) between an output transistor NOUT and a current source Iref of the differential amplifier (3) to generate a first power supply reference voltage VG1 at a drain of the output transistor NOUT and generate a voltage offset Voff leading to a voltage VG2=VG1+Voff at its terminal connected to the current source Iref.

\* \* \* \* \*